(12) United States Patent
Cho et al.

(10) Patent No.: US 12,369,462 B2
(45) Date of Patent: Jul. 22, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Hyunmin Cho, Yongin-si (KR); Taesung Kim, Yongin-si (KR); Sungwon Cho, Yongin-si (KR); Yunjong Yeo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 556 days.

(21) Appl. No.: 17/868,885

(22) Filed: Jul. 20, 2022

(65) Prior Publication Data

US 2023/0052920 A1 Feb. 16, 2023

(30) Foreign Application Priority Data

Aug. 13, 2021 (KR) .................. 10-2021-0107531

(51) Int. Cl.
*H10K 59/124* (2023.01)
*H10K 59/126* (2023.01)
*H10K 71/00* (2023.01)
*H10K 59/12* (2023.01)
*H10K 59/123* (2023.01)

(52) U.S. Cl.
CPC ......... *H10K 59/124* (2023.02); *H10K 59/126* (2023.02); *H10K 71/00* (2023.02); *H10K 59/1201* (2023.02); *H10K 59/123* (2023.02)

(58) Field of Classification Search
CPC . H10K 59/124; H10K 59/126; H10K 59/1201
USPC ............................................... 257/43
See application file for complete search history.

(56) References Cited

U.S. PATENT DOCUMENTS

| | | | |
|---|---|---|---|
| 6,294,805 B1 | 9/2001 | Jung | |
| 7,781,812 B2 | 8/2010 | Izumi | |
| 9,646,829 B2* | 5/2017 | Ohno | H01L 21/02565 |
| 10,090,337 B2 | 10/2018 | Okumura et al. | |
| 10,797,123 B2* | 10/2020 | Cho | H10D 86/441 |
| 2004/0051153 A1 | 3/2004 | Yamamoto et al. | |
| 2019/0288043 A1* | 9/2019 | Shin | H10K 50/816 |
| 2021/0202910 A1 | 7/2021 | Lee | |

FOREIGN PATENT DOCUMENTS

| | | |
|---|---|---|
| CN | 112271197 A | 1/2021 |
| JP | 4893304 B2 | 3/2012 |
| KR | 100200704 B1 | 6/1999 |
| KR | 1020190098311 A | 8/2019 |

(Continued)

*Primary Examiner* — Xia L Cross
(74) *Attorney, Agent, or Firm* — CANTOR COLBURN LLP

(57) ABSTRACT

A display apparatus includes: a substrate; a first semiconductor layer disposed over the substrate; a first insulating layer disposed on the first semiconductor layer; a second insulating layer disposed on the first insulating layer; a first oxide material layer disposed between the substrate and the second insulating layer; and a first conductive layer disposed on the second insulating layer and electrically connected to the first semiconductor layer through a first contact hole defined in the first insulating layer, the second insulating layer, and the first oxide material layer.

20 Claims, 19 Drawing Sheets

(56) References Cited

FOREIGN PATENT DOCUMENTS

| | | |
|---|---|---|
| KR | 102148478 B1 | 8/2020 |
| KR | 1020210084835 A | 7/2021 |
| KR | 1020210094500 A | 7/2021 |
| LR | 102148478 B1 | 8/2020 |

* cited by examiner

DISPLAY APPARATUS AND METHOD OF MANUFACTURING THE SAME

This application claims priority to Korean Patent Application No. 10-2021-0107531, filed on Aug. 13, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus.

2. Description of the Related Art

A display apparatus visually displays data. Display apparatuses are used in displays of miniaturized products such as mobile phones and used in displays of large-scale products such as televisions.

A display apparatus includes a plurality of pixels, each of which receives an electrical signal and emits light to display images. Each pixel includes a display element. As an example, an organic light-emitting display apparatus includes an organic light-emitting diode as a display element. Generally, an organic light-emitting display apparatus operates by including a thin-film transistor and an organic light-emitting diode over a substrate, where the organic light-emitting diode spontaneously emits light.

Recently, as a display apparatus are widely used in various fields, designs that improve the quality of a display apparatus have been tried in various ways.

SUMMARY

One or more embodiments include a display apparatus that prevents a portion of an inorganic layer from remaining when forming a contact hole exposing at least a portion of a semiconductor layer therethrough, and a method of manufacturing the display apparatus.

According to one or more embodiments, a display apparatus includes: a substrate; a first semiconductor layer disposed over the substrate; a first insulating layer disposed on the first semiconductor layer; a second insulating layer disposed on the first insulating layer; a first oxide material layer disposed between the substrate and the second insulating layer and having water solubility; and a first conductive layer disposed on the second insulating layer and electrically connected to the first semiconductor layer through a first contact hole defined in the first insulating layer, the second insulating layer, and the first oxide material layer.

In an embodiment, the first oxide material layer may be disposed between the first insulating layer and the second insulating layer.

In an embodiment, the first oxide material layer may be disposed between the first semiconductor layer and the first insulating layer.

In an embodiment, the first oxide material layer may include at least one selected from molybdenum oxide ($MoO_x$) and tungsten oxide ($WO_x$).

In an embodiment, the first oxide material layer may have a thickness in a range of about 30 angstrom (Å) to about 300 Å.

In an embodiment, the display apparatus may further include: a first gate electrode insulated from the first semiconductor layer; and an upper electrode disposed between the first insulating layer and the second insulating layer.

In an embodiment, the first oxide material layer may be disposed directly on the upper electrode.

In an embodiment, the display apparatus may further include a second semiconductor layer disposed in a layer different from a layer in which the first semiconductor layer is disposed, where the first semiconductor layer may include an oxide semiconductor material, and the second semiconductor layer may include a silicon semiconductor material.

In an embodiment, the second semiconductor layer may be disposed closer to the substrate than the first semiconductor layer.

In an embodiment, the display apparatus may further include a second conductive layer disposed on the second insulating layer, where the second conductive layer may be electrically connected to the second semiconductor layer through a second contact hole.

In an embodiment, the display apparatus may further include: a second gate electrode insulated from the second semiconductor layer; and a second oxide material layer disposed on the second gate electrode.

In an embodiment, the display apparatus may further include: a bottom metal layer disposed on the substrate; and a buffer layer disposed between the bottom metal layer and the first semiconductor layer.

In an embodiment, the first oxide material layer may be disposed between the bottom metal layer and the first semiconductor layer.

In an embodiment, the first conductive layer may be electrically connected to the bottom metal layer through a third contact hole.

According to one or more embodiments, a method of manufacturing a display apparatus includes: providing a semiconductor layer on a substrate; providing a first insulating layer on the semiconductor layer; providing an oxide material layer having water solubility on the first insulating layer; providing a second insulating layer on the oxide material layer; providing a photoresist pattern on the second insulating layer; forming a contact hole by etching the first insulating layer, the oxide material layer, and the second insulating layer by using the photoresist pattern as an etch mask; and stripping the photoresist pattern.

In an embodiment, at least a portion of the oxide material layer may be removed when the photoresist pattern is stripped.

In an embodiment, the oxide material layer may include at least one selected from molybdenum oxide ($MoO_x$) and tungsten oxide ($WO_x$).

In an embodiment, the oxide material layer may have a thickness in a range of about 30 Å to about 300 Å.

In an embodiment, the method may further include, after the stripping the photoresist pattern, providing a conductive layer on the second insulating layer.

In an embodiment, the conductive layer may be electrically connected to the semiconductor layer through the contact hole.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
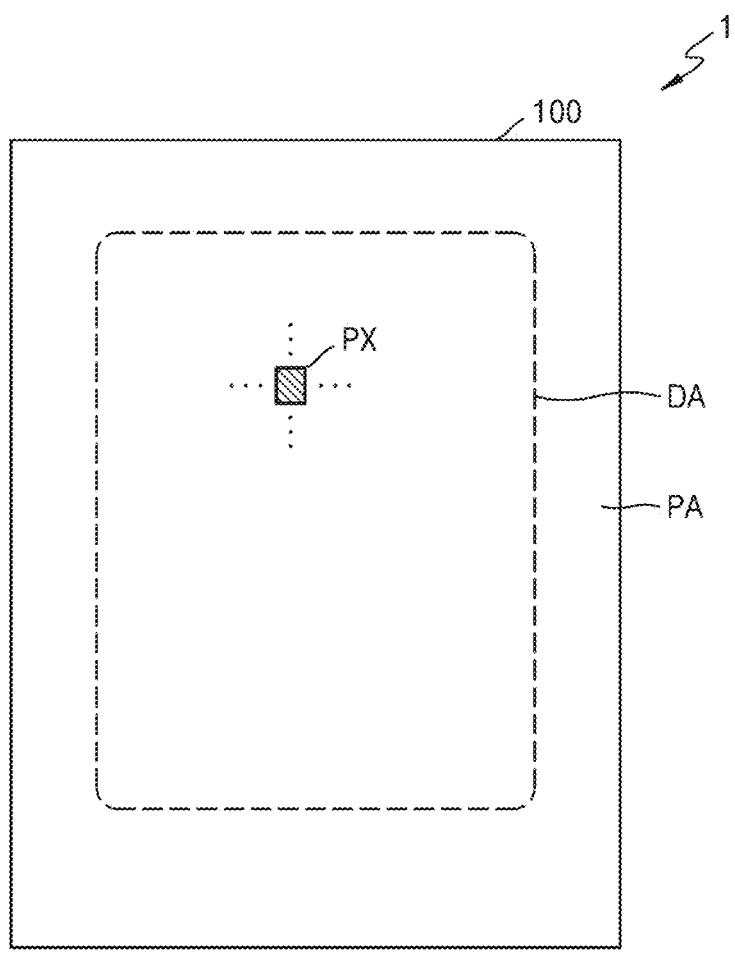
FIG. 1 is a plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of elements in the drawings may be exaggerated or reduced for convenience of explanation. For example, since sizes and thicknesses of elements in the drawings are arbitrarily illustrated for convenience of explanation, the disclosure is not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

As used herein, when a wiring is referred to as "extending in a first direction or a second direction", it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a plan view of a display apparatus 1 according to an embodiment.

Referring to FIG. 1, an embodiment of the display apparatus 1 may include a display area DA and a peripheral area PA outside the display area DA. The display apparatus 1 may display images to the outside by using light emitted from the display area DA.

A substrate 100 of the display apparatus 1 may include various materials such as glass, metal, plastic, or the like. In an embodiment, the substrate 100 may include a flexible material. Here, the flexible material may be a material that may be effectively warped, bent, folded, or rolled. In an embodiment, for example, the flexible material may include ultra-thin glass, metal, or plastic.

Pixels PX, each including various display elements such as an organic light-emitting diode OLED, may be arranged (or disposed) in the display area DA of the substrate 100. The pixel PX may be provided in plural. The plurality of pixels PX may be arranged in various configurations including a stripe configuration, a pentile configuration, a mosaic configuration, and the like to display images.

In an embodiment, when viewed in a plan view, the display area DA may have a rectangular shape as shown in FIG. 1. Alternatively, the display area DA may have a polygonal shape such as a triangle, a pentagon, and a hexagon, a circular shape, an elliptical shape, or an irregular shape.

The peripheral area PA of the substrate 100 is a region arranged outside the display area DA and may be a region in which images are not displayed. Various wirings or pads may be arranged in the peripheral area PA, and the various wirings may be configured to transfer an electric signal to be applied to the display area DA, and a printed circuit board or a driver integrated circuit ("IC") chip may be attached to the pads.

Figure 2:
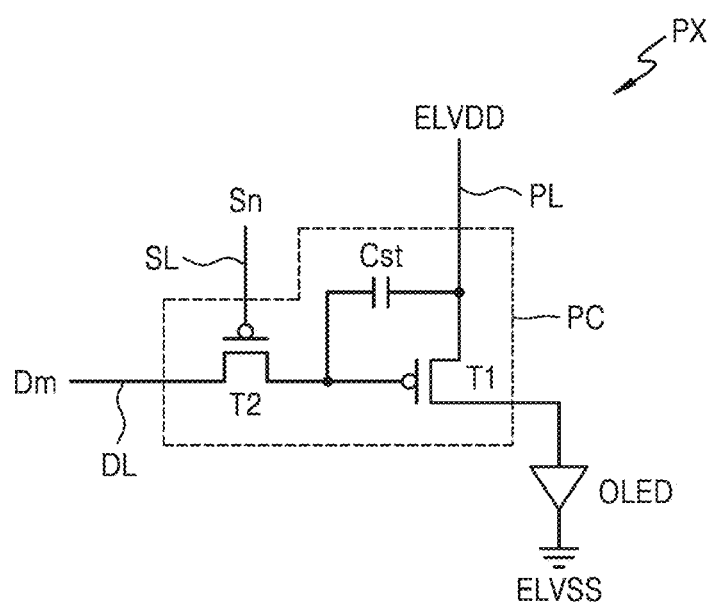
FIG. 2 is an equivalent circuit diagram of a pixel of a display apparatus according to an embodiment.

FIG. 2 is an equivalent circuit diagram of a pixel of the display apparatus 1 according to an embodiment.

Referring to FIG. 2, an embodiment of the pixel PX may include a pixel circuit PC and a display element connected to the pixel circuit PC, and the pixel circuit PC may be connected to a scan line SL and a data line DL. The display element may be an organic light-emitting diode OLED including an anode and a cathode. The cathode of the organic light-emitting diode OLED may be a common electrode to which a second driving voltage ELVSS is applied.

The pixel circuit PC may include a first transistor T1, a second transistor T2, and a storage capacitor Cst.

The first transistor T1 may be a driving transistor in which the magnitude of a drain current thereof is determined based on a gate-source voltage thereof. The second transistor T2 may be a switching transistor turned on/off based on a gate-source voltage thereof, substantially a gate voltage thereof. The first transistor T1 and the second transistor T2 may each be a thin-film transistor.

The storage capacitor Cst may be connected between a power line PL and a gate of the first transistor T1. The storage capacitor Cst may include a second electrode and a first electrode, the second electrode may be connected to the power line PL, and the first electrode may be connected to the gate of the first transistor T1. The storage capacitor Cst may store a voltage corresponding to a difference between a voltage transferred from the second transistor T2 and a first driving voltage ELVDD supplied to the power line PL.

The first transistor T1 may be configured to control the magnitude of a current flowing from the power line PL to the organic light-emitting diode OLED based on a gate-source voltage thereof. The organic light-emitting diode OLED may emit light having a preset brightness corresponding to a driving current. The first transistor T1 may include the gate, a drain, and a source, where the gate is connected to the first electrode of the storage capacitor Cst, the drain is connected to the power line PL, and the source is connected to the organic light-emitting diode OLED.

The second transistor T2 may be configured to transfer a data voltage Dm to the gate of the first transistor T1 in response to a scan signal Sn. The second transistor T2 may include a gate, a drain, and a source, where the gate is connected to the scan line SL, the drain is connected to the data line DL, and the source is connected to the gate of the first transistor T1.

Though FIG. 2 shows an embodiment where the pixel circuit PC includes two transistors and a single storage capacitor, the embodiment is not limited thereto. In an alternative embodiment, for example, the pixel circuit PC may include three or more transistors and/or two or more storage capacitors. In an embodiment, the pixel circuit PC may include three transistors and a single storage capacitor. Alternatively, the pixel circuit PC may include seven transistors and a single storage capacitor.

Figure 3:
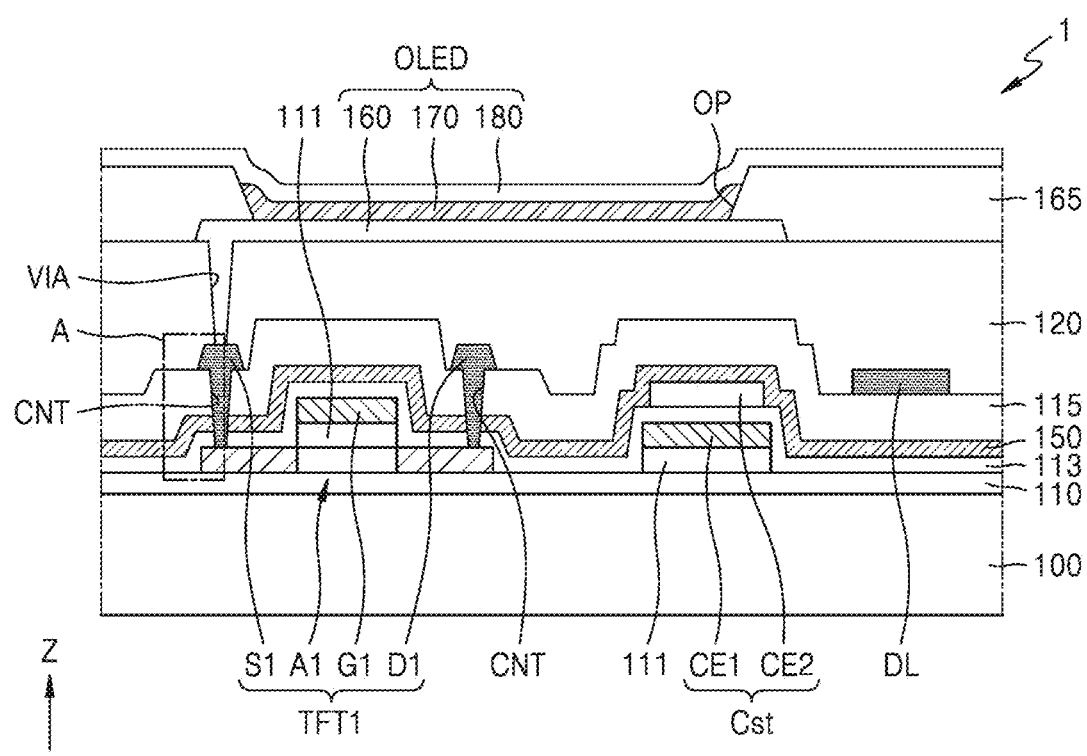
FIG. 3 is a cross-sectional view of a display apparatus according to an embodiment.

FIG. 3 is a cross-sectional view of the display apparatus 1 according to an embodiment. FIG. 3 shows the cross-section of an embodiment of the display apparatus 1 and some elements thereof may be omitted.

Referring to FIG. 3, an embodiment of the display apparatus 1 may include the substrate 100 and a first thin-film transistor TFT1 and a light-emitting element OLED, each arranged (or disposed) over the substrate 100.

In an embodiment, the substrate 100 may include glass or a polymer resin. In such an embodiment, the polymer resin may include at least one selected from polyethersulfone, polyarylate, polyetherimide, polyethylene naphthalate, polyethylene terephthalate, polyphenylene sulfide, polyimide, polycarbonate, cellulose tri acetate, and cellulose acetate propionate. The substrate 100 may have a structure in which a layer including an organic material and a layer including an inorganic material are alternately stacked one on another. In an embodiment, for example, the substrate 100 may include a first base layer, a first barrier layer, a second base layer, and a second barrier layer that are sequentially stacked one on another.

A buffer layer 110 may be arranged on the substrate 100. The buffer layer 110 may reduce or block the penetration of foreign materials, moisture, or external air from below the substrate 100. The buffer layer 110 may include an inorganic material such as silicon oxide, silicon oxynitride, and silicon nitride and have a single layer structure or a multi-layer structure, each layer therein including at least one selected from the above materials.

The first thin-film transistor TFT1 may be arranged on the buffer layer 110. The first thin-film transistor TFT1 may include a first semiconductor layer A1, a first gate electrode G1, a first source electrode S1, and a first drain electrode D1.

In an embodiment, the first semiconductor layer A1 may be arranged on the buffer layer 110. The first semiconductor layer A1 may include a channel region, a source region, and a drain region, where the source region and the drain region are on two opposite sides of the channel region. The source region and the drain region may be doped with impurities including N-type impurities or P-type impurities.

In an embodiment, the first semiconductor layer A1 may include at least one selected from an oxide semiconductor material and a silicon semiconductor material. In an embodiment where the first semiconductor layer A1 includes an oxide semiconductor material, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, for example, the first semiconductor layer A1 may include In—Ga—Zn—O ("IGZO"), In—Sn—Zn—O ("ITZO"), or In—Ga—Sn—Zn—O ("IGTZO") semiconductor containing metal such as indium (In), gallium (Ga), and stannum (Sn) in ZnO. In an embodiment where the first semiconductor layer A1 includes a silicon semiconductor material, the first semiconductor layer A1 may include amorphous silicon or polycrystalline silicon.

In an embodiment, the first gate electrode G1 may be arranged on the first semiconductor layer A1. The first gate electrode G1 may overlap the first semiconductor layer A1 with a first gate insulating layer 111 therebetween. In such an embodiment, the first semiconductor layer A1 may be insulated from the first gate electrode G1 by the first gate insulating layer 111. The first gate electrode G1 may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The first gate electrode G1 may have a single layer structure or a multi-layer structure, each layer therein including at least one selected from the above materials.

In an embodiment, the first gate insulating layer 111 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

In an embodiment, the first gate insulating layer 111 may be patterned to overlap a portion of the first semiconductor layer A1 thereunder. In an embodiment, for example, the first gate insulating layer 111 may be patterned to expose a source region and/or a drain region of the first semiconductor layer A1. In such an embodiment, the first gate insulating layer 111 may be patterned to correspond to the channel region of the first semiconductor layer A1. In an embodiment, the first gate insulating layer 111 may be patterned to correspond to the first gate electrode G1 thereon. However, the embodiment is not limited thereto. In an alternative embodiment, the first gate insulating layer 111 may be arranged over the entire surface of the display area DA (see FIG. 1).

In an embodiment, a first interlayer insulating layer 113 may be arranged on the first gate electrode G1. In an embodiment, a first insulating layer may be arranged on the first gate electrode G1. In an embodiment, for example, the first insulating layer may define the first interlayer insulating layer 113.

In an embodiment, the first interlayer insulating layer 113 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

In an embodiment, a second interlayer insulating layer 115 may be arranged on the first interlayer insulating layer 113. In an embodiment, a second insulating layer may be arranged on the first interlayer insulating layer 113. In an embodiment, for example, the second insulating layer may define the second interlayer insulating layer 115.

The second interlayer insulating layer 115 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

In an embodiment, the storage capacitor Cst may be arranged over the substrate 100. The storage capacitor Cst may include a lower electrode CE1 and an upper electrode CE2. The lower electrode CE1 may be arranged on the first gate insulating layer 111. In an embodiment, for example, the lower electrode CE1 may include the same material as that of the first gate electrode G1 and be arranged on the same layer as the first gate electrode G1. The upper electrode CE2 may be arranged on the first interlayer insulating layer 113. The first interlayer insulating layer 113 may serve as a dielectric layer of the storage capacitor Cst. In an embodiment, an oxide material layer 150 may be directly arranged on the upper electrode CE2.

The first source electrode S1, the first drain electrode D1, and the data line DL may be arranged on the second interlayer insulating layer 115. In an embodiment, a first conductive layer may be arranged on the second interlayer insulating layer 115. In an embodiment, for example, the first conductive layer may be one of the source electrode S1 and the first drain electrode D1.

The first source electrode S1, the first drain electrode D1, and the data line DL may each include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The first source electrode S1, the first drain electrode D1, and the data line DL may each have a single layer structure or a multi-layer structure, each layer herein including at least one selected from the above materials. In an embodiment, for example, the first source electrode S1, the first drain electrode D1, and the data line DL may each include a triple layer of Ti/Al/Ti.

In an embodiment, the oxide material layer 150 may be further arranged over substrate 100. The oxide material layer 150 may be arranged between the first interlayer insulating layer 113 and the second interlayer insulating layer 115.

Figure 4:
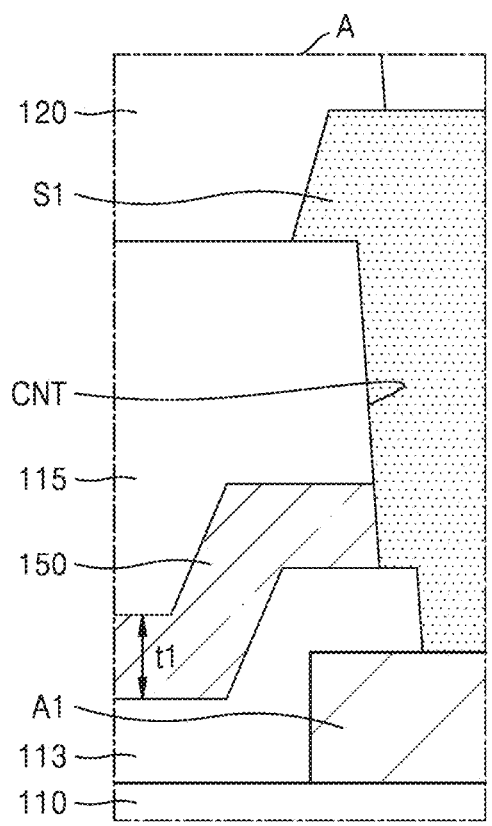
FIG. 4 is an enlarged view of region A of FIG. 3.

FIG. 4 is an enlarged view of region A of FIG. 3.

Referring to FIGS. 3 and 4, in an embodiment, contact holes CNT may be defined in the first interlayer insulating layer 113, the oxide material layer 150, and the second interlayer insulating layer 115. In an embodiment, the first source electrode S1 and the first drain electrode D1 may each be electrically connected to the first semiconductor layer A1 through the contact holes CNT. In such an embodiment, the first source electrode S1 may be electrically connected to a source region of the first semiconductor layer A1 through the contact hole CNT, and the first drain electrode D1 may be electrically connected to a drain region of the first semiconductor layer A1 through the contact hole CNT.

As described below, in an embodiment where the contact holes CNT are formed by etching at least a portion of the first interlayer insulating layer 113 and the second interlayer insulating layer 115, residual materials of the second interlayer insulating layer 115 may remain inside the contact holes CNT and the residual materials remaining inside the contact holes CNT may cause a fence defect. In an embodiment, for example, due to the residual materials remaining inside the contact holes CNT, disconnection may occur to the conductive layer (e.g., the source electrode and the drain electrode) arranged inside the contact holes CNT and a contact resistance may increase. In such an embodiment, because the second interlayer insulating layer 115 includes an inorganic layer, the residual material of the second interlayer insulating layer 115 may be an inorganic layer.

In an embodiment, the oxide material layer 150 is arranged between the first interlayer insulating layer 113 and the second interlayer insulating layer 115, such that remaining of the inorganic layers inside the contact holes CNT may be effectively prevented or substantially reduced, and thus, the occurrence of disconnection in the conductive layer (e.g., the source electrode and the drain electrode) arranged inside the contact holes CNT may be effectively prevented or substantially reduced, and the increase in the contact resistance may be effectively prevented or substantially reduced. An embodiment of the method of manufacturing the display apparatus will be described later in detail.

In an embodiment, the oxide material layer 150 may include at least one selected from molybdenum oxide ($MoO_x$) and tungsten oxide ($WO_x$). In an embodiment, as described below, the oxide material layer 150 includes at least one selected from molybdenum oxide ($MoO_x$) and tungsten oxide ($WO_x$) having water solubility, such that a fence defect may be effectively prevented or substantially reduced from occurring because residual materials of the second interlayer insulating layer 115 on the oxide material layer 150 are removed together while at least a portion of the oxide material layer 150 is removed during a process of stripping a photoresist pattern. In an embodiment, for example, the disconnection in the conductive layer (e.g., the source electrode and the drain electrode) arranged inside the contact holes CNT due to the residual materials of the second interlayer insulating layer 115 may be effectively prevented or substantially reduced from occurring, and the increase in the contact resistance may be effectively prevented or substantially reduced.

In an embodiment, the oxide material layer 150 may have a thickness t1 in a range of about 30 angstrom (Å) to about 300 Å. In such an embodiment, the oxide material layer 150 may be provided to have the thickness t1 in a range of about 30 Å to about 300 Å from the upper surface of the first interlayer insulating layer 113 thereunder. In a case where the thickness t1 of the oxide material layer 150 is less than 30 Å, the oxide material layer 150 may not have a uniform thickness. That is, a thickness distribution of the oxide material layer 150 may increase. In a case where the thickness t1 of the oxide material layer 150 exceeds about 300 Å, the oxide material layer 150 under the second interlayer insulating layer 115 may be removed together during the process of stripping the photoresist pattern, and thus, an empty space may be formed under the second interlayer insulating layer 115. In an embodiment of the invention, the oxide material layer 150 has a thickness in a range of about 30 Å to about 300 Å, such that the oxide material layer 150 may have a uniform thickness and only the oxide material layer 150 arranged under the residual materials of the second interlayer insulating layer 115 may be removed during the process of stripping the photoresist pattern.

Referring back to FIG. 3, a first planarization layer 120 may be arranged on the first source electrode S1, the first drain electrode D1, and the data line DL. The first planarization layer 120 may have a single layer structure or a multi-layer structure, each layer therein including an organic material, and provide a flat upper surface. The first planarization layer 120 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The light-emitting element OLED may be arranged on the first planarization layer 120. The light-emitting element OLED may include a pixel electrode 160, an intermediate layer 170, and an opposite electrode 180. In an embodiment, the pixel electrode 160 may be an anode, and the opposite electrode 180 may be a cathode. However, the embodiment is not limited thereto.

The pixel electrode 160 may be arranged on the first planarization layer 120. The pixel electrode 160 may be electrically connected to the source electrode S1 and/or the first drain electrode D1 through a via hole VIA defined in the first planarization layer 120.

The pixel electrode 160 may be a (semi) light-transmissive electrode or a reflective electrode. In an embodiment, the pixel electrode 160 may include a reflective layer and a transparent or semi-transparent electrode layer on the reflective layer, where the reflective layer includes at least one selected from silver (Ag), magnesium (Mg), aluminum (Al), platinum (Pt), palladium (Pd), gold (Au), nickel (Ni), neodymium (Nd), iridium (Ir), chrome (Cr), and a compound thereof. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, for example, the pixel electrode 160 may have a structure of ITO/Ag/ITO.

A pixel-defining layer 165 may be arranged on the pixel electrode 160, and an opening OP that exposes at least a portion of the pixel electrode 160 is defined through the pixel-defining layer 165. The opening OP defined in the pixel-defining layer 165 may define an emission area through which light from the light-emitting element OLED is emitted. In an embodiment, for example, the size/width of the opening OP may correspond to the size/width of the emission area.

The pixel-defining layer 165 may prevent an arc and the like from occurring at the edges of the pixel electrode 160 by increasing a distance between the edges of the pixel electrode 160 and the opposite electrode 180 over the pixel electrode 160. The pixel-defining layer 165 may include at least one organic insulating material selected from polyimide, polyamide, an acrylic resin, benzocyclobutene, and a phenolic resin, and may be formed by spin coating and the like.

The intermediate layer 170 may be arranged on the pixel electrode 160. The intermediate layer 170 may include a first functional layer, an emission layer, and a second functional layer. The emission layer may be arranged in the opening OP of the pixel-defining layer 165. The emission layer may include a polymer organic material or a low-molecular weight organic material emitting light of a preset color. Alternatively, the emission layer may include an inorganic light-emitting material or quantum dots.

A first functional layer and a second functional layer may be respectively arranged under and on the emission layer. The first functional layer may include, for example, a hole transport layer ("HTL"), or an HTL and a hole injection layer ("HIL"). The second functional layer may include an electron transport layer ("ETL") and/or an electron injection layer ("EIL"). However, the embodiment is not limited thereto. The first functional layer and the second functional layer may be selectively and respectively arranged on and under the emission layer. Like the opposite electrode 180 described below, the first functional layer and/or the second functional layer may be common layers formed to cover the substrate 100 entirely.

The opposite electrode 180 may be arranged on the pixel electrode 160 and may overlap the pixel electrode 160. The opposite electrode 180 may include a conductive material having a low work function. In an embodiment, for example, the opposite electrode 180 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 180 may further include a layer on the (semi) transparent layer including the above materials, the layer including ITO, IZO, ZnO, or $In_2O_3$. The opposite electrode 180 may be formed as a single unitary body to cover the substrate 100 entirely.

Though not shown, an encapsulation member may be arranged on the light-emitting element OLED. In an embodiment, for example, a thin-film encapsulation layer or an encapsulation substrate may be arranged on the light-emitting element OLED. In an embodiment where the thin-film encapsulation layer is arranged on the light-emitting element OLED, the thin-film encapsulation layer may include at least one inorganic layer and at least one organic layer.

Figure 5:
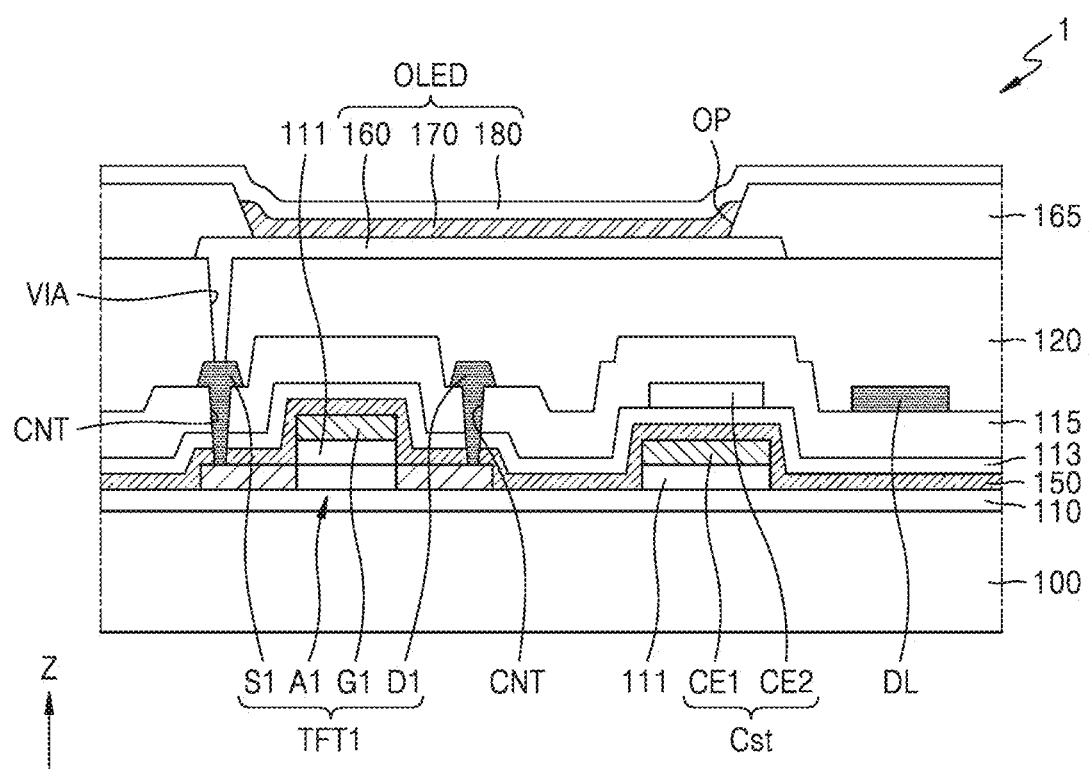
FIG. 5 is a cross-sectional view of a display apparatus according to an embodiment.

FIG. 5 is a cross-sectional view of the display apparatus 1 according to an embodiment. FIG. 5 shows the cross-section of an embodiment of the display apparatus 1 and some of the elements thereof may be omitted. The embodiment of FIG. 5 is substantially the same as the embodiment of FIG. 3 except that the oxide material layer 150 is arranged between the first semiconductor layer A1 and the first interlayer insulating layer 113. In FIG. 5, the same reference numerals as those of FIG. 3 may denote the same elements, and any repetitive detailed description thereof may be omitted.

Referring to FIG. 5, an embodiment of the display apparatus 1 may include the substrate 100, the first thin-film transistor TFT1 and the light-emitting element OLED each arranged over the substrate 100.

The buffer layer 110 may be arranged on the substrate 100. The first semiconductor layer A1 may be arranged on the buffer layer 110. The first semiconductor layer A1 may include at least one of an oxide semiconductor material and a silicon semiconductor material.

The first gate electrode G1 may be arranged over the first semiconductor layer A1. The first gate insulating layer 111 may be arranged between the first semiconductor layer A1 and the first gate electrode G1. Though FIG. 5 shows an embodiment where the first gate insulating layer 111 is patterned in a similar shape to that of the first gate electrode G1, the embodiment is not limited thereto. Alternatively, the first gate insulating layer 111 may be arranged on the entire surface of the display area DA (see FIG. 1).

In an embodiment, the first gate insulating layer 111 and the lower electrode CE1 may be sequentially arranged on the buffer layer 110. The first gate insulating layer 111 may be patterned in a similar shape to that of the lower electrode CE1 thereon.

In an embodiment, the oxide material layer 150 may be arranged on the first gate electrode G1. The oxide material layer 150 may be provided to cover at least a portion of the first semiconductor layer A1, the first gate electrode G1, and the lower electrode CE1. As described above with reference to FIG. 3, the oxide material layer 150 may include at least one selected from molybdenum oxide ($MoO_x$) and tungsten oxide ($WO_x$). In such an embodiment, the oxide material layer 150 may have a thickness in a range of about 30 Å to about 300 Å.

In an embodiment, the first interlayer insulating layer 113 and the second interlayer insulating layer 115 may be sequentially arranged on the oxide material layer 150. In an embodiment, the first interlayer insulating layer 113 may define a first insulating layer, and the second interlayer insulating layer 115 may define a second insulating layer.

The first source electrode S1, the first drain electrode D1, and the data line DL may be arranged on the second interlayer insulating layer 115. In an embodiment, a first conductive layer may be arranged on the second interlayer insulating layer 115. In an embodiment, for example, the first conductive layer may define the first source electrode S1 or the first drain electrode D1.

In an embodiment, the contact hole CNT may be defined in the oxide material layer 150, the first interlayer insulating layer 113, and the second interlayer insulating layer 115. The first source electrode S1 and the first drain electrode D1 may each be electrically connected to the first semiconductor layer A1 through the contact hole CNT. In an embodiment, the first source electrode S1 may be electrically connected to the source region of the first semiconductor layer A1 through the contact hole CNT, and the first drain electrode D1 may be electrically connected to the drain region of the first semiconductor layer A1 through the contact hole CNT.

The first planarization layer 120 may be arranged on the first source electrode S1, the first drain electrode D1, and the data line DL. The light-emitting element OLED may be arranged on the first planarization layer 120, the light-emitting element OLED including the pixel electrode 160, the intermediate layer 170, and the opposite electrode 180.

Figure 6:
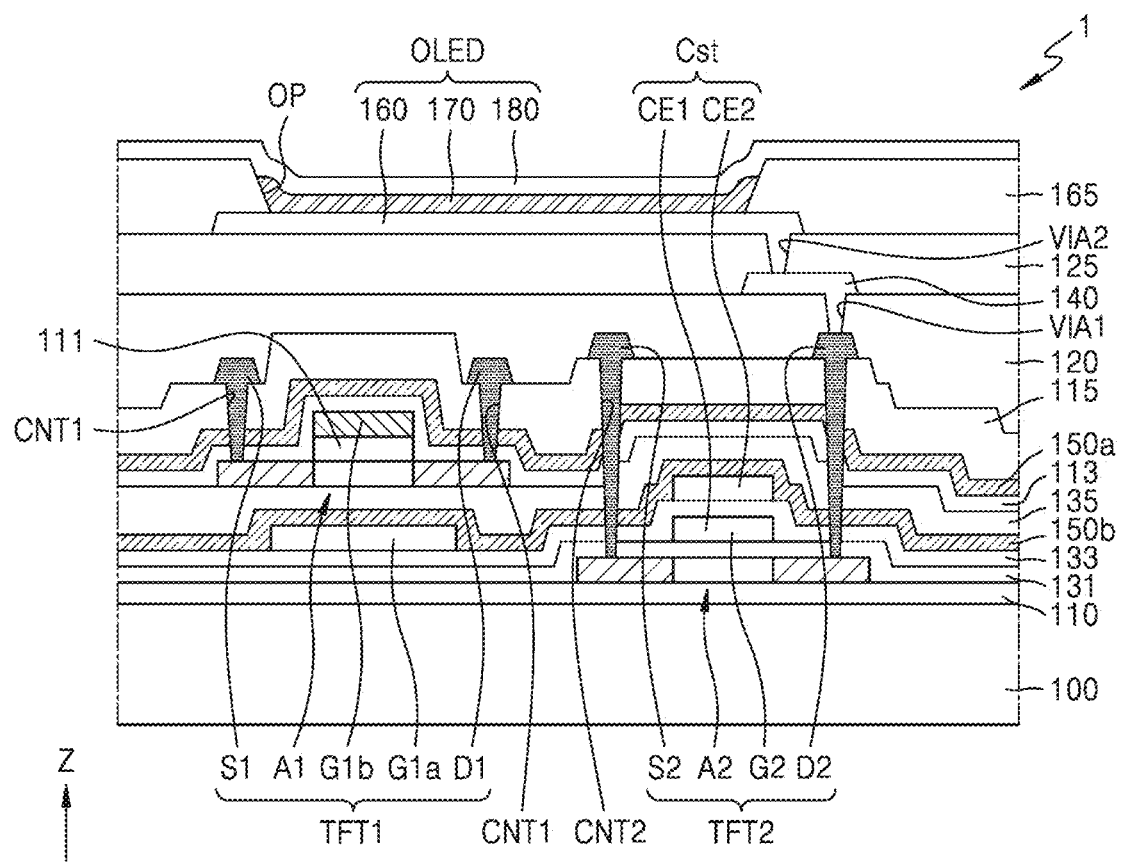
FIG. 6 is a cross-sectional view of a display apparatus according to an embodiment.

FIG. 6 is a cross-sectional view of the display apparatus 1 according to an embodiment. FIG. 6 shows the cross-section of an embodiment of the display apparatus 1 and some of elements thereof may be omitted. In FIG. 6, the same reference numerals as those of FIG. 3 may denote the same elements, and any repetitive detailed description thereof may be omitted.

Referring to FIG. 6, an embodiment of the display apparatus 1 may include the substrate 100, the first thin-film transistor TFT1, a second thin-film transistor TFT2, and the light-emitting element OLED.

The first thin-film transistor TFT1, the second thin-film transistor TFT2, the storage capacitor Cst, and the light-emitting element OLED may be arranged over the substrate 100. The first thin-film transistor TFT1 may include the first semiconductor layer A1, a first lower gate electrode G1a, a first upper gate electrode G1b, the first source electrode S1, and the first drain electrode D1. The second thin-film transistor TFT2 may include a second semiconductor layer A2, a second gate electrode G2, a second source electrode S2, and a second drain electrode D2. The storage capacitor Cst may include the lower electrode CE1 and the upper electrode CE2. The light-emitting element OLED may include the pixel electrode 160, the intermediate layer 170, and the opposite electrode 180.

In an embodiment, the first semiconductor layer A1 may include an oxide semiconductor material, and the second semiconductor layer A2 may include a silicon semiconductor material. In an embodiment, for example, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, for example, the first semiconductor layer A1 may include IGZO, ITZO, or IGTZO semiconductor containing metal such as indium (In), gallium (Ga), and stannum (Sn) in ZnO. In an embodiment, the second semiconductor layer A2 may include amorphous silicon or polycrystalline silicon. However, the embodiment is not limited thereto.

In an embodiment, the second semiconductor layer A2 may be arranged closer to the substrate 100 than the first semiconductor layer A1. In an embodiment, for example, in a direction perpendicular to a plane in which the substrate 100 is arranged, that is, in a thickness direction of the substrate 100, a distance from the upper surface of the substrate 100 to the lower surface of the second semiconductor layer A2 may be less than a distance from the upper surface of the substrate 100 to the lower surface of the first semiconductor layer A1. In such an embodiment, a vertical distance from the upper surface of the substrate 100 to the lower surface of the second semiconductor layer A2 may be less than a distance from the upper surface of the substrate 100 to the lower surface of the first semiconductor layer A1.

The buffer layer 110 may be arranged on the substrate 100. The second semiconductor layer A2 may be arranged on the buffer layer 110. The second semiconductor layer A2 may include a channel region, a source region, and a drain region, the source region and the drain region being on two opposite sides of the channel region. The source region and the drain region may be doped with impurities, and the impurities may include N-type impurities or P-type impurities.

A second gate insulating layer 131 may be arranged on the second semiconductor layer A2. The second gate insulating layer 131 may be provided to cover the second semiconductor layer A2. The second gate insulating layer 131 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

The second gate electrode G2 may be arranged on the second gate insulating layer 131. The second gate electrode G2 may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The second gate electrode G2 may have a single layer structure or a multi-layer structure, each layer therein including at least one selected from the above materials.

In an embodiment, although FIG. 6 shows an embodiment where the second gate insulating layer 131 is arranged over the entire surface of the display area DA, the embodiment is not limited thereto. In an alternative embodiment, for example, the second gate insulating layer 131 may be patterned to correspond to the shape of the second gate electrode G2.

A third interlayer insulating layer 133 may be arranged on the second gate electrode G2. The third interlayer insulating layer 133 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

The first lower gate electrode G1a and the upper electrode CE2 may be arranged on the third interlayer insulating layer 133. The first lower gate electrode G1a and the upper electrode CE2 may be arranged in or directly on a same layer as each other and may include a same material as each other.

The upper electrode CE2 may overlap at least a portion of the lower electrode CE1. The upper electrode CE2 and the lower electrode CE1 may constitute the storage capacitor Cst. The third interlayer insulating layer 133 arranged between the upper electrode CE2 and the lower electrode CE1 may serve as a dielectric layer of the storage capacitor Cst.

In an embodiment, the lower electrode CE1 and the second gate electrode G2 may be provided as one body or integrally formed with each other as a single unitary unit. However, the embodiment is not limited thereto. In an alternative embodiment, for example, the lower electrode CE1 may be apart from the second gate electrode G2 and provided as a separate element.

A second oxide material layer 150b may be arranged on the upper electrode CE2. In an embodiment, for example, the second oxide material layer 150b may be directly arranged on the upper electrode CE2. A fourth interlayer insulating layer 135 may be arranged on the second oxide material layer 150b. The fourth interlayer insulating layer 135 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$). However, the embodiment is not limited thereto. In an alternative embodiment, for example, the second oxide material layer 150b may be omitted.

In an embodiment, the second oxide material layer 150b may include at least one selected from molybdenum oxide ($MoO_x$) and tungsten oxide ($WO_x$). In such an embodiment, as described below, the second oxide material layer 150b includes at least one selected from molybdenum oxide ($MoO_x$) and tungsten oxide ($WO_x$) having water solubility, such that a fence defect may be effectively prevented or substantially reduced from occurring because residual materials of the fourth interlayer insulating layer 135 on the fourth interlayer insulating layer 135 are removed together while at least a portion of the second oxide material layer 150b is removed during a process of stripping a photoresist pattern.

In an embodiment, the second oxide material layer 150b may have a thickness in a range of about 30 Å to about 300 Å. Specifically, the second oxide material layer 150b may be provided to have the thickness in a range of about 30 Å to about 300 Å from the upper surface of the third interlayer insulating layer 133 thereunder. In a case where the thickness of the second oxide material layer 150b is less than 30 Å, the second oxide material layer 150b may not have a uniform thickness. That is, a thickness distribution of the second oxide material layer 150b may increase. In a case where the thickness of the second oxide material layer 150b exceeds about 300 Å, the second oxide material layer 150b under the fourth interlayer insulating layer 135 may be removed together during the process of stripping the photoresist pattern, and thus, an empty space may be formed under the fourth interlayer insulating layer 135. In an embodiment of the invention, as described above, the second oxide material layer 150b has a thickness of in a range about 30 Å to about 300 Å, such that the second oxide material layer 150b may have a uniform thickness and only the second oxide material layer 150b arranged under the residual materials of the fourth interlayer insulating layer 135 may be removed during the process of stripping the photoresist pattern.

In an embodiment, as described above, the first lower gate electrode G1a may be arranged on the third interlayer insulating layer 133. In such an embodiment, the second oxide material layer 150b may be arranged on the first lower gate electrode G1a, and the fourth interlayer insulating layer 135 may be arranged on the second oxide material layer 150b. In an embodiment, for example, the second oxide material layer 150b may be arranged directly on the first lower gate electrode G1a.

The first semiconductor layer A1 may be arranged on the fourth interlayer insulating layer 135. In an embodiment, as described above, the first semiconductor layer A1 may include an oxide semiconductor material. The first gate insulating layer 111 may be arranged on the first semiconductor layer A1, and the first upper gate electrode G1b may be arranged on the first gate insulating layer 111. Though FIG. 6 shows an embodiment where the first gate insulating layer 111 is patterned in a similar shape to that of the first upper gate electrode G1b, the embodiment is not limited thereto. Alternatively, the first gate insulating layer 111 may be arranged over the entire surface of the display area DA (see FIG. 1).

The first interlayer insulating layer 113 may be arranged on the first upper gate electrode G1b. A first oxide material layer 150a may be arranged on the first interlayer insulating layer 113. The second interlayer insulating layer 115 may be arranged on the first oxide material layer 150a. The first oxide material layer 150a may be the same member as the oxide material layer 150 of FIG. 3. Though FIG. 6 shows an embodiment where the first oxide material layer 150a is arranged between the first interlayer insulating layer 113 and the second interlayer insulating layer 115, the embodiment is not limited thereto. Alternatively, the first oxide material layer 150a may be arranged between the first semiconductor layer A1 and the first interlayer insulating layer 113. Alternatively, the first oxide material layer 150a may be arranged both between the first semiconductor layer A1 and the first interlayer insulating layer 113 and between the first interlayer insulating layer 113 and the second interlayer insulating layer 115.

The first source electrode S1, the first drain electrode D1, the second source electrode S2, and the second drain electrode D2 may be arranged on the second interlayer insulating layer 115. The first conductive layer and the second conductive layer may be arranged on the second interlayer insulating layer 115. In an embodiment, for example, the first conductive layer may define the first source electrode S1 or the first drain electrode D1. In such an embodiment, the second conductive layer may define the second source electrode S2 or the second drain electrode D2.

In an embodiment, a first contact hole CNT1 may be defined in the first interlayer insulating layer 113, the first oxide material layer 150a, and the second interlayer insulating layer 115. The first source electrode S1 and the first drain electrode D1 may each be electrically connected to the first semiconductor layer A1 through the first contact hole CNT1. In such an embodiment, the first source electrode S1 may be electrically connected to the source region of the first semiconductor layer A1 through the first contact hole CNT1, and the first drain electrode D1 may be electrically connected to the drain region of the first semiconductor layer A1 through the first contact hole CNT1.

In an embodiment, a second contact hole CNT2 may be defined in the second gate insulating layer 131, the third interlayer insulating layer 133, the second oxide material layer 150b, the fourth interlayer insulating layer 135, the first interlayer insulating layer 113, the first oxide material layer 150a, and the second interlayer insulating layer 115. The second source electrode S2 and the second drain electrode D2 may each be electrically connected to the second semiconductor layer A2 through the second contact hole CNT2. In such an embodiment, the second source electrode S2 may be electrically connected to the source region of the second semiconductor layer A2 through the second contact hole CNT2, and the second drain electrode D2 may be electrically connected to the drain region of the second semiconductor layer A2 through the second contact hole CNT2.

In an embodiment, as described above, the first conductive layer and the second conductive layer are arranged on the second interlayer insulating layer 115, the first semiconductor layer A1 is arranged on the fourth interlayer insulating layer 135, and the second semiconductor layer A2 is arranged on the buffer layer 110, such that a vertical distance between the first conductive layer and the first semiconductor layer A1 may be less than a vertical distance between the second conductive layer and the second semiconductor layer A2.

In such an embodiment, the first conductive layer is electrically connected to the first semiconductor layer A1 through the first contact hole CNT1, and the second conductive layer is electrically connected to the second semiconductor layer A2 through the second contact hole CNT2, such that a vertical distance of the first contact hole CNT1 may be less than a vertical distance of the second contact hole CNT2.

The first contact hole CNT1 and the second contact hole CNT2 are simultaneously formed during a same etching process, and because the thickness of an inorganic layer between the second conductive layer and the second semiconductor layer A2 is greater than the thickness of an inorganic layer between the first conductive layer and the first semiconductor layer A1, the surface of the first semiconductor layer A1 may be exposed to an etching gas for more time and thus damaged. To prevent such a damage, in an embodiment where a high carbon-based gas having high selectivity for SiO$_x$/IGZO is used, a portion of the inorganic layer may remain inside the first contact hole CNT1 or polymers may be accumulated and not be removed during an etching operation.

In an embodiment, as described below, the first oxide material layer 150a includes at least one selected from molybdenum oxide (MoO$_x$) and tungsten oxide (WO$_x$) having water solubility, such that residual materials of the second interlayer insulating layer 115 on the first oxide material layer 150a are removed together while at least a portion of the first oxide material layer 150a is removed during a process of stripping a photoresist pattern, and thus, remaining of an inorganic layer and/or polymers inside the first contact hole CNT1 may be effectively prevented or substantially reduced.

The first source electrode S1, the first drain electrode D1, the second source electrode S2, and the second drain electrode D2 may be arranged on the first planarization layer 120. A second planarization layer 125 may be arranged on the first planarization layer 120. In an embodiment, the first planarization layer 120 and the second planarization layer 125 may each include the same material. However, the embodiment is not limited thereto. In an embodiment, for example, the first planarization layer 120 may include a material different from that of the second planarization layer 125.

A connection electrode 140 may be arranged between the first planarization layer 120 and the second planarization layer 125. The pixel electrode 160 may be arranged on the second planarization layer 125. The connection electrode 140 may be electrically connected to the second source electrode S2 and/or the second drain electrode D2 through a first via hole VIA1 defined in the first planarization layer 120. In an embodiment, the pixel electrode 160 may be electrically connected to the connection electrode 140 through a second via hole VIA2 defined in the second planarization layer 125. Accordingly, the pixel electrode 160 may be electrically connected to the second thin-film transistor TFT2.

Figure 7:
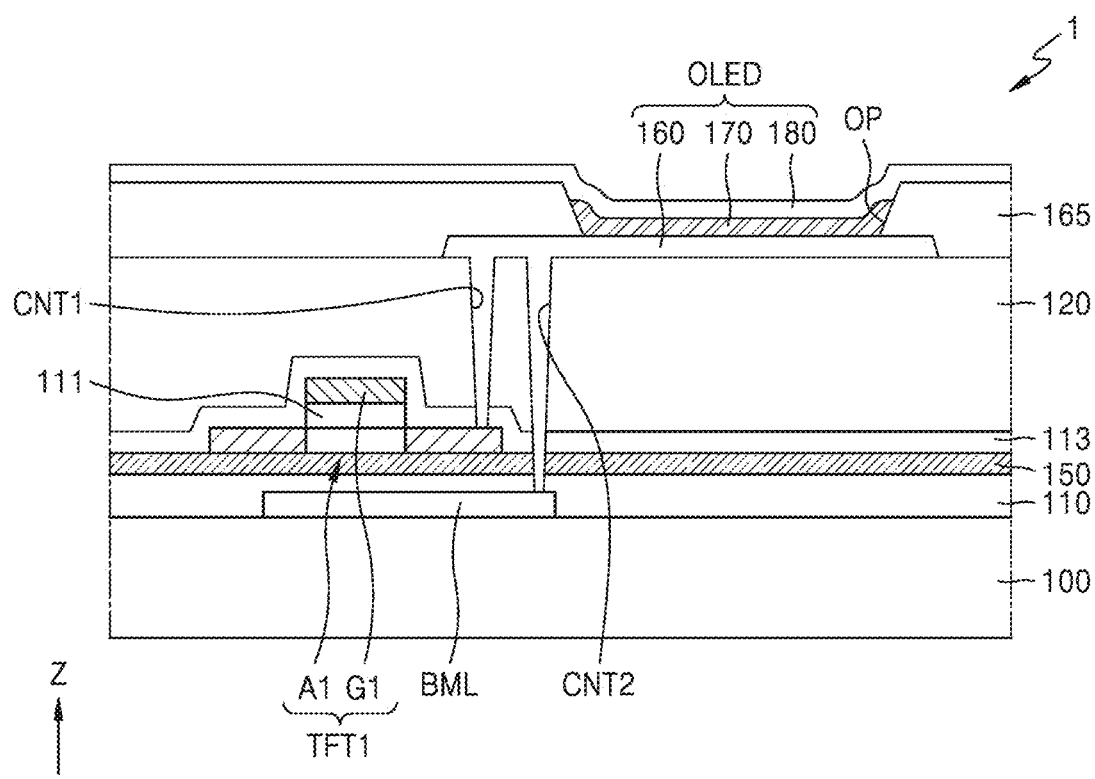
FIG. 7 is a cross-sectional view of a display apparatus according to an embodiment.

FIG. 7 is a cross-sectional view of the display apparatus 1 according to an embodiment. FIG. 7 shows the cross-section of an embodiment of the display apparatus 1 and some of elements thereof may be omitted. In FIG. 7, the same reference numerals as those of FIG. 3 may denote the same elements, and any repetitive detailed description thereof may be omitted.

Referring to FIG. 7, an embodiment of the display apparatus 1 may include the substrate 100, the first thin-film transistor TFT1, and the light-emitting element OLED arranged on the substrate 100. The first thin-film transistor TFT1 may include the first semiconductor layer A1 and the first gate electrode G1. The light-emitting element OLED may include the pixel electrode 160, the intermediate layer 170, and the opposite electrode 180.

A bottom metal layer BML may be arranged on the substrate 100. The buffer layer 110 may be arranged on the bottom metal layer BML. The first semiconductor layer A1 may be arranged on the buffer layer 110. The bottom metal layer BML may overlap at least a portion of the first thin-film transistor TFT1 thereabove. In an embodiment, the bottom metal layer BML may overlap at least a portion of the first semiconductor layer A1 thereabove.

In an embodiment where the first semiconductor layer A1 includes an oxide semiconductor material, the first semiconductor layer A1 may be vulnerable to light. In such an embodiment, the bottom metal layer BML is arranged below the first semiconductor layer A1, such that a photo-current may be effectively prevented from occurring to the first semiconductor layer A1 due to external light incident from the substrate 100, and thus, change in the element characteristics of the first thin-film transistor TFT1 may be effectively prevented or substantially reduced.

The first gate insulating layer 111 may be arranged on the first semiconductor layer A1. The first gate electrode G1 may be arranged on the first gate insulating layer 111. In addition, the first interlayer insulating layer 113 may be arranged on the first gate electrode G1. In an embodiment, for example, the first interlayer insulating layer 113 may be provided to cover elements thereunder.

The first planarization layer 120 may be arranged on the first interlayer insulating layer 113. The pixel electrode 160 may be arranged on the first planarization layer 120. The first conductive layer may be arranged on the first planarization layer 120. In an embodiment, for example, the first conductive layer may denote the pixel electrode 160.

In an embodiment, the oxide material layer 150 may be arranged between the buffer layer 110 and the first semiconductor layer A1. In an embodiment, as described above, the oxide material layer 150 may include at least one selected from molybdenum oxide (MoO$_x$) and tungsten oxide (WO$_x$).

In an embodiment, the pixel electrode 160 may be electrically connected to the first semiconductor layer A1 through the first contact hole CNT1 defined in the first interlayer insulating layer 113 and the first planarization layer 120 and electrically connected to the bottom metal layer BML through the second contact hole CNT2 defined in the buffer layer 110, the oxide material layer 150, the first interlayer insulating layer 113, and the first planarization layer 120.

In an embodiment, as described above, the first conductive layer is arranged on the first planarization layer 120, the first semiconductor layer A1 is arranged on the buffer layer 110, and the bottom metal layer BML is arranged on the substrate 100, such that a vertical distance between the first conductive layer and the first semiconductor layer A1 may be less than a vertical distance between the first conductive layer and the bottom metal layer BML. In such an embodiment, the first semiconductor layer A1 may be closer to the first conductive layer than the bottom metal layer BML.

The first contact hole CNT1 and the second contact hole CNT2 are simultaneously formed during a same etching process, and because the thickness of layers between the first conductive layer and the bottom metal layer BML is greater than the thickness of layers between the first conductive layer and the first semiconductor layer A1, the surface of the first semiconductor layer A1 may be exposed to an etching gas for more time and thus damaged. To prevent such a damage, in an embodiment where a high carbon-based gas having high selectivity for SiO$_x$/IGZO is used, a portion of the inorganic layer may remain inside the first contact hole CNT1 or polymers may be accumulated and not be removed during an etching operation.

In an embodiment, as described below, the oxide material layer 150 includes at least one selected from molybdenum oxide (MoO$_x$) and tungsten oxide (WO$_x$) having water solubility, such that residual materials of the first interlayer insulating layer 113 on the oxide material layer 150 are removed together while at least a portion of the oxide material layer 150 is removed during a process of stripping a photoresist pattern, and thus, remaining of an inorganic layer and/or polymers inside the first contact hole CNT1 and/or the second contact hole CNT2 may be effectively prevented or substantially reduced.

FIGS. 8 to 18 are cross-sectional views showing a method of manufacturing a display apparatus according to an embodiment. FIGS. 8 to 18 show the cross-section of an embodiment of the display apparatus 1 and some of elements thereof may be omitted.

Referring to FIGS. 8 to 18, an embodiment of a method of manufacturing a display apparatus may include: forming (or providing) the first semiconductor layer A1 on the substrate 100; forming the first insulating layer on the first semiconductor layer A1; forming the oxide material layer 150 having water solubility on the first insulating layer; forming the second insulating layer on the oxide material layer 150; forming a photoresist pattern 155 on the second insulating layer; forming the contact hole CNT by etching the first insulating layer, the oxide material layer 150, and the second insulating layer by using the photoresist pattern 155 as an etch mask; and stripping the photoresist pattern 155.

Figure 8:
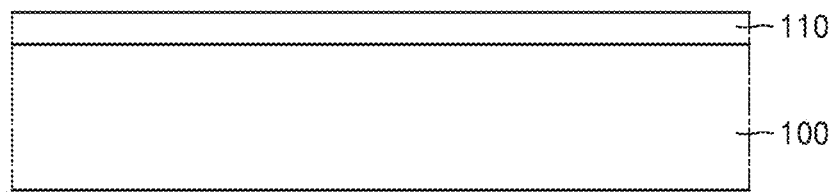
FIGS. 8 to 18 are cross-sectional views showing a method of manufacturing a display apparatus according to an embodiment.

First, referring to FIG. 8, the buffer layer 110 may be formed (or provided) on the substrate 100. The substrate 100 may include glass or a polymer resin. In such an embodiment, the polymer resin may include at least one selected from polyethersulfone, polyarylate, polyetherimide, polyethylene naphthalate, polyethylene terephthalate, polyphenylene sulfide, polyimide, polycarbonate, cellulose tri acetate, and cellulose acetate propionate. The substrate may have a structure in which a layer including an organic material and a layer including an inorganic material are alternately stacked one on another. In an embodiment, for example, the substrate 100 may include the first base layer, the first barrier layer, the second base layer, and the second barrier layer that are sequentially stacked. The buffer layer 110 may reduce or block the penetration of foreign materials, moisture, or external air from below the substrate 100. The buffer layer 110 may include an inorganic material such as silicon oxide, silicon oxynitride, and silicon nitride and have a single layer structure or a multi-layer structure, each layer therein including at least one selected from the above materials.

Figure 9:
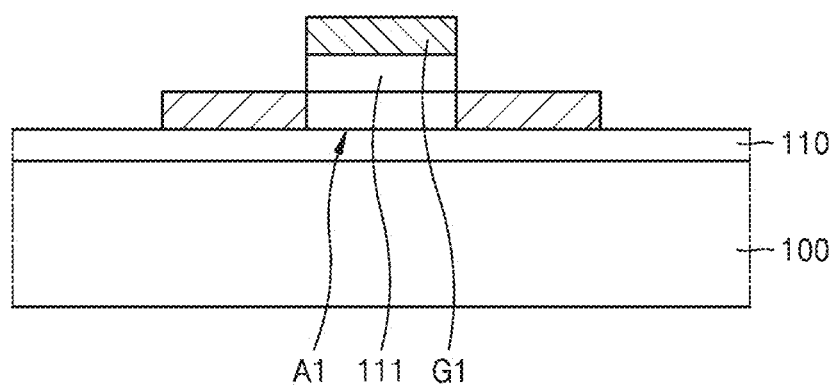

Referring to FIG. 9, the first semiconductor layer A1, the first gate insulating layer 111, and the first gate electrode G1 may be formed on the substrate 100. In an embodiment, the first semiconductor layer A1 may be patterned on the buffer layer 110, and a material for forming the first gate insulating layer 111 and the first gate electrode G1 may be formed on the first semiconductor layer A1 that is patterned. Then, The material formed on the first semiconductor layer A1 may be patterned to form the first gate insulating layer 111 and the first gate electrode G1.

Then, at least a portion of the first semiconductor layer A1 may be doped with impurities to form a channel region, a source region, and a drain region, the source region and the drain region being on two opposite sides of the channel region. In an embodiment, for example, the source region and the drain region correspond to the impurity-doped regions, and the channel region corresponds to a region overlapping the first gate insulating layer 111 and the first gate electrode G1. In such an embodiment, the impurities may include N-type impurities or P-type impurities.

In an embodiment, the first semiconductor layer A1 may include at least one selected from an oxide semiconductor material and a silicon semiconductor material. In an embodiment where the first semiconductor layer A1 includes an oxide semiconductor material, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, for example, the first semiconductor layer A1 may include IGZO, ITZO, or IGTZO semiconductor containing metal such as indium (In), gallium (Ga), and stannum (Sn) in ZnO. In an embodiment where the first semiconductor layer A1 includes a silicon semiconductor material, the first semiconductor layer A1 may include amorphous silicon or polycrystalline silicon.

Though FIG. 9 shows an embodiment where the first gate insulating layer 111 is patterned to correspond to the shape of the first gate electrode G1 thereon, the embodiment is not limited thereto. In an alternative embodiment, for example, the first gate insulating layer 111 may be formed over the upper surface of the substrate 100 entirely. The first gate insulating layer 111 on the first semiconductor layer A1 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, zinc oxide ($ZnO_x$) may be zinc oxide (ZnO) and/or zinc peroxide ($ZnO_2$).

The first gate electrode G1 may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The first gate electrode G1 may have a single layer structure or a multi-layer structure, each layer therein including at least one selected from the above materials.

Figure 10:
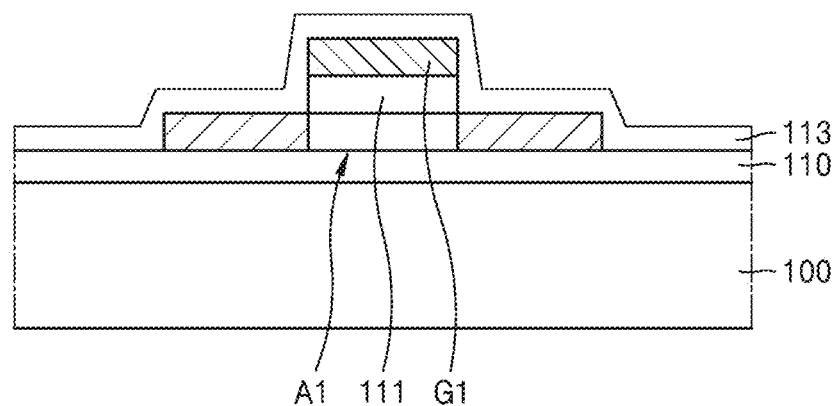

Referring to FIG. 10, the first insulating layer may be formed on the first semiconductor layer A1. In an embodiment, the first interlayer insulating layer 113 may be formed on the first semiconductor layer A1 and the first gate electrode G1. In such an embodiment, the first interlayer insulating layer 113 may be the first insulating layer.

In an embodiment, the first interlayer insulating layer 113 may be formed to have a thickness in a range of about 1000 Å from the upper surface of the first semiconductor layer A1. However, the embodiment is not limited thereto. The first interlayer insulating layer 113 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, zinc oxide ($ZnO_x$) may be zinc oxide (ZnO) and/or zinc peroxide ($ZnO_2$).

Figure 11:
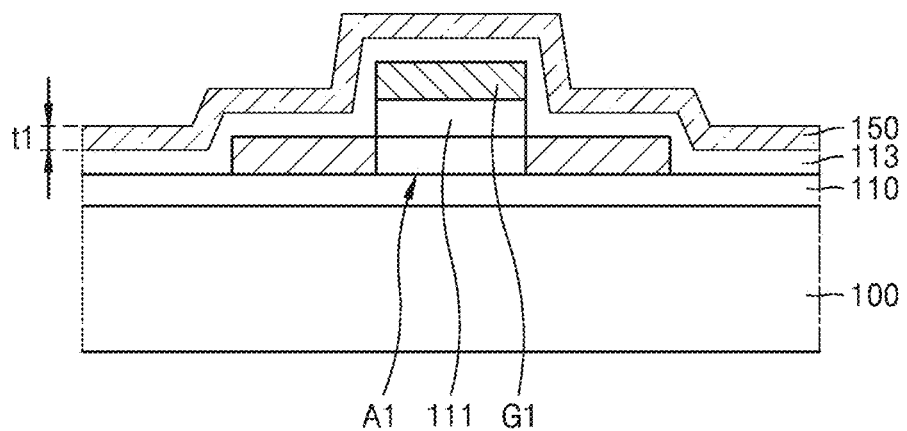

Referring to FIG. 11, the oxide material layer 150 may be formed on the first insulating layer. In an embodiment, the oxide material layer 150 may be formed on the first interlayer insulating layer 113. In such an embodiment, the first interlayer insulating layer 113 may be the first insulating layer.

In an embodiment, the oxide material layer 150 may include at least one selected from molybdenum oxide ($MoO_x$) and tungsten oxide ($WO_x$) having water solubility. In an embodiment, the oxide material layer 150 may have a thickness t1 in a range of about 30 Å to about 300 Å.

Figure 12:
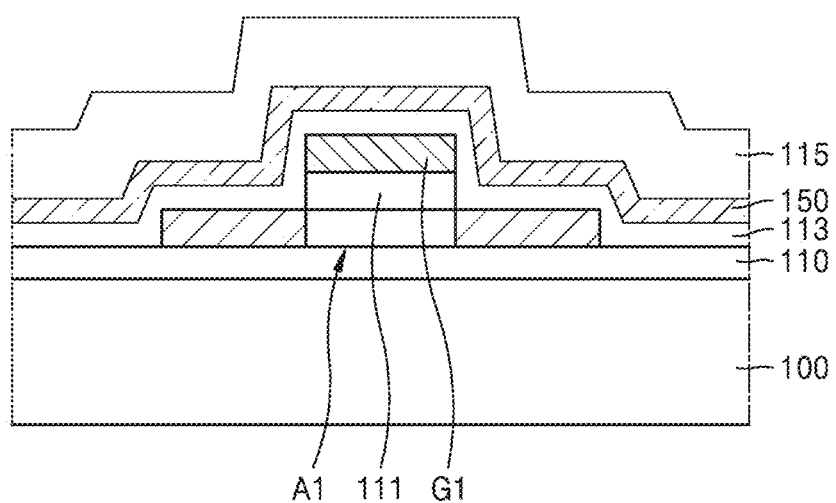

Referring to FIG. 12, the second insulating layer may be formed on the oxide material layer 150. in an embodiment, the second interlayer insulating layer 115 may be formed on the oxide material layer 150. In such an embodiment, the second interlayer insulating layer 115 may denote the second insulating layer.

In an embodiment, the second interlayer insulating layer 115 may be formed to have a thickness in a range of about 5000 Å from the upper surface of the oxide material layer 150. However, the embodiment is not limited thereto. The second interlayer insulating layer 115 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In such an embodiment, zinc oxide ($ZnO_x$) may be zinc oxide (ZnO) and/or zinc peroxide ($ZnO_2$).

Figure 13:
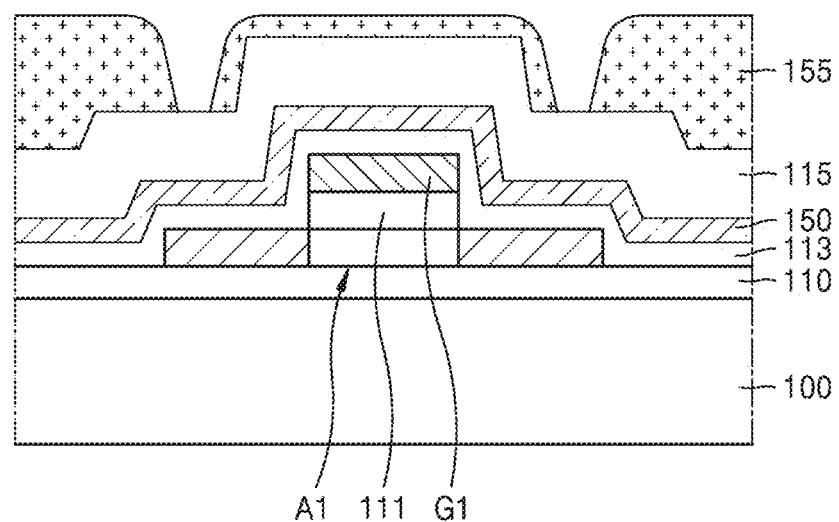

Referring to FIG. 13, the photoresist pattern 155 may be formed on the second insulating layer. In an embodiment, the photoresist pattern 155 may be formed by coating a photoresist material on the second interlayer insulating layer 115 and exposing and developing the same.

Figure 14:
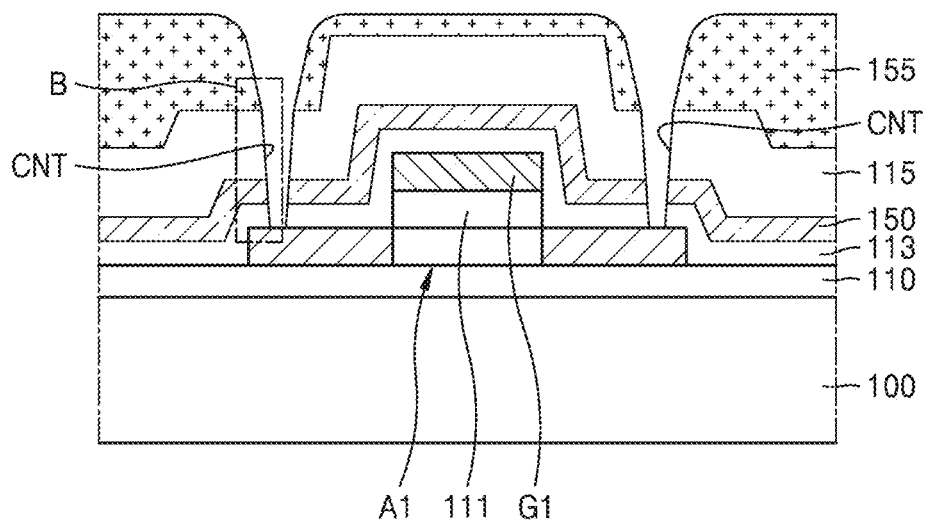

Then, referring to FIG. 14, the contact hole CNT may be formed by etching the first insulating layer, the oxide material layer 150, and the second insulating layer by using the photoresist pattern 155 on the second insulating layer as an etch mask. In an embodiment, the contact hole CNT may be formed by etching the first interlayer insulating layer 113, the oxide material layer 150, and the second interlayer insulating layer 115 using the photoresist pattern 155 on the second interlayer insulating layer 115 as an etch mask. In such an embodiment, the first interlayer insulating layer 113 may be the first insulating layer, and the second interlayer insulating layer 115 may be the second insulating layer.

In an embodiment, as described above, the contact hole CNT is formed by etching the first interlayer insulating layer 113, the oxide material layer 150, and the second interlayer insulating layer 115 using the photoresist pattern 155 as an etch mask, such that at least a portion of the semiconductor layer A1 may be exposed through the contact hole CNT.

Figure 15:
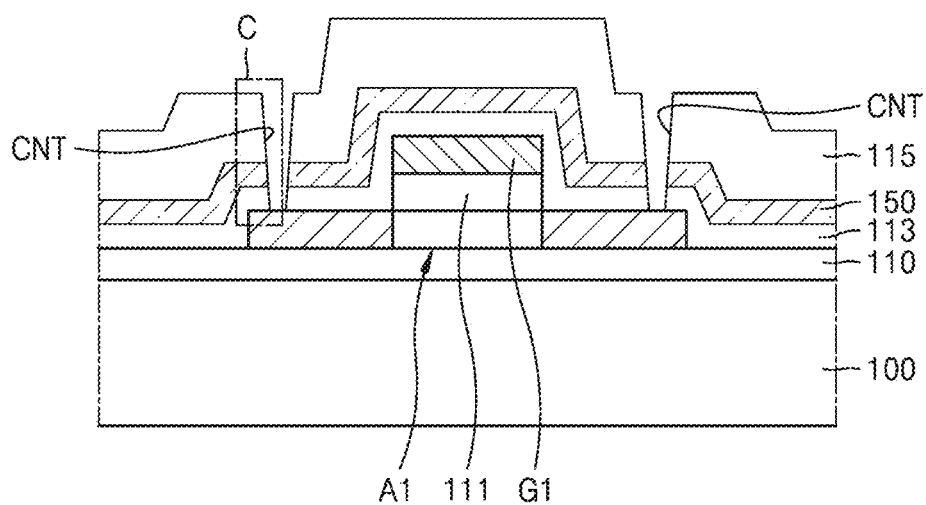

Then, as shown in FIG. 15, the photoresist pattern 155 on the second insulating layer may be stripped. Specifically, the photoresist pattern 155 on the second interlayer insulating layer 115 may be removed by water such as deionized (DI) water.

In this case, at least a portion of the oxide material layer 150 on the first interlayer insulating layer 113 may be removed. In an embodiment, for example, at least a portion of the oxide material layer 150 may be dissolved in water.

Figure 16:
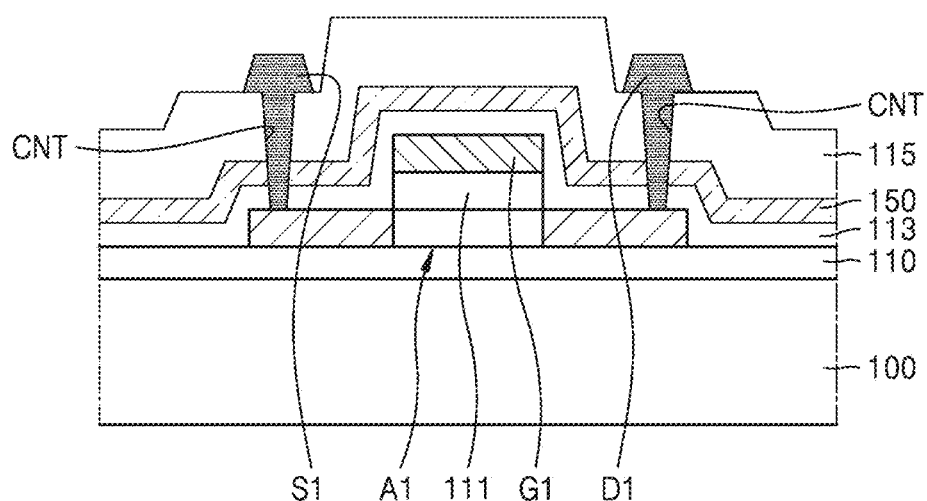

Referring to FIG. 16, a conductive layer may be formed on the second insulating layer. In an embodiment, the first source electrode S1 and the first drain electrode D1 may be formed on the second interlayer insulating layer 115. In such an embodiment, the second interlayer insulating layer 115 may be the second insulating layer, and the first source electrode S1 and the first drain electrode D1 may be the conductive layer.

In an embodiment, the first source electrode S1 may be electrically connected to the source region of the first semiconductor layer A1 through the contact hole CNT, and the first drain electrode D1 may be electrically connected to the drain region of the first semiconductor layer A1 through the contact hole CNT.

Figure 17:
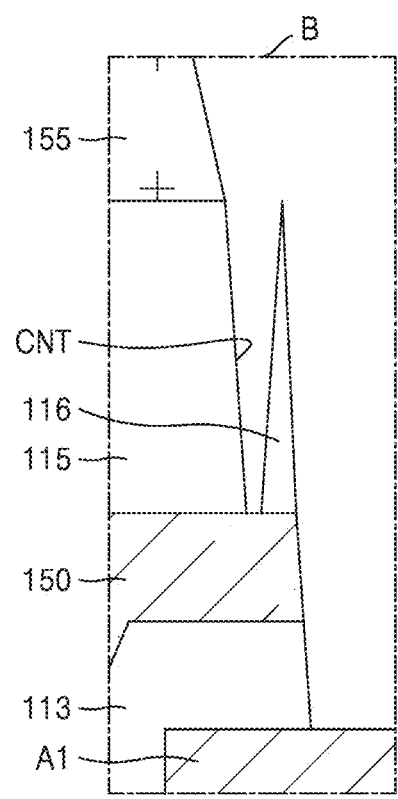
Figure 18:
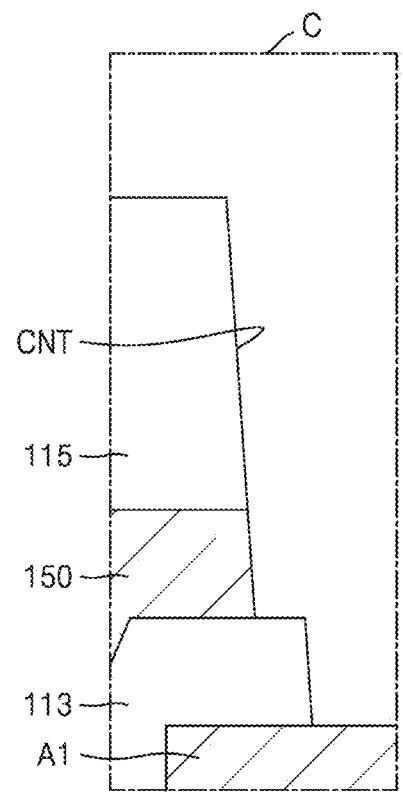

FIG. 17 is an enlarged view of region B of FIG. 14, and FIG. 18 is an enlarged view of region C of FIG. 15.

Referring to FIGS. 14, 15, 17, and 18, while the contact hole CNT is formed by etching the first interlayer insulating layer 113, the oxide material layer 150, and the second interlayer insulating layer 115 using the photoresist pattern 155 as an etch mask, residual materials 116 of the second interlayer insulating layer 115 may remain inside the contact hole CNT, and the residual materials 116 remaining inside the contact hole CNT may cause a fence defect. In an embodiment, for example, due to the residual materials 116 remaining inside the contact hole CNT, disconnection may occur in the conductive layer (the first source electrode S1 or the first drain electrode D1, see FIG. 18) arranged inside the contact hole CNT, and a contact resistance between the conductive layer and the first semiconductor layer A1 may increase. In such an embodiment, because the second interlayer insulating layer 115 includes an inorganic layer, the residual materials 116 of the second interlayer insulating layer 115 may be an inorganic layer. Alternatively, as described above with reference to FIG. 6, in an embodiment where a high carbon-based gas is used to prevent the surface of the first semiconductor layer A1 from being damaged, there may be polymers inside the contact hole CNT, and a defect may occur due to the polymers.

In an embodiment of the invention, as described above, during a process of stripping the photoresist pattern 155 on the second insulating layer (e.g., the second interlayer insulating layer 115), at least a portion of the oxide material layer 150 on the first insulating layer (e.g., the first interlayer insulating layer 113) may be removed together.

In such an embodiment, for example, the oxide material layer 150 includes at least one selected from molybdenum oxide ($MoO_x$) and tungsten oxide ($WO_x$) having water solubility, such that a fence defect may be effectively prevented or substantially reduced from occurring, because residual materials 116 of the second insulating layer (e.g., the second interlayer insulating layer 115) on the oxide material layer 150 are removed together while at least a portion of the oxide material layer 150 is removed during a process of stripping a photoresist pattern. Accordingly, disconnection in the conductive layer (e.g., the source electrode and the drain electrode) inside the contact hole CNT due to the residual materials 116 of the second insulating layer (e.g., the second interlayer insulating layer 115) may be effectively prevented or substantially reduced from occurring, and a rise of a contact resistance between the conductive layer and the first semiconductor layer A1 may be prevented or reduced. In such an embodiment, without addition of a process, the residual materials 116 of the second insulating layer (e.g., the second interlayer insulating layer 115) inside the contact hole CNT may be removed. In an embodiment, for example, because an area in which the oxide material layer 150 meets the residual materials 116 of the second insulating layer (e.g., the second interlayer insulating layer 115) is small, the oxide material layer 150 may be easily removed.

In an embodiment, as described above, the oxide material layer 150 may have a thickness t1 in a range of about 30 Å to about 300 Å. In such an embodiment, the oxide material layer 150 may be provided to have the thickness t1 in a range of about 30 Å to about 300 Å from the upper surface of the first insulating layer (e.g., the first interlayer insulating layer 113) thereunder. In a case where the thickness t1 of the oxide material layer 150 is less than 30 Å, the oxide material layer 150 may not have a uniform thickness. That is, a thickness distribution of the oxide material layer 150 may increase. In a case where the thickness t1 of the oxide material layer 150 exceeds about 300 Å, the oxide material layer 150 under the second insulating layer (e.g., the second interlayer insulating layer 115) may be removed together during the process of stripping the photoresist pattern 155, and thus, an empty space may be formed under the second insulating layer (e.g., the second interlayer insulating layer 115). In an embodiment of the invention, as described above, the oxide material layer 150 has a thickness in a range of about 30 Å to about 300 Å, such that the oxide material layer 150 may have a uniform thickness and only the oxide material layer 150 arranged under the residual materials 116 of the second insulating layer (e.g., the second interlayer insulating layer 115) may be removed during the process of stripping the photoresist pattern 155.

Figure 19:
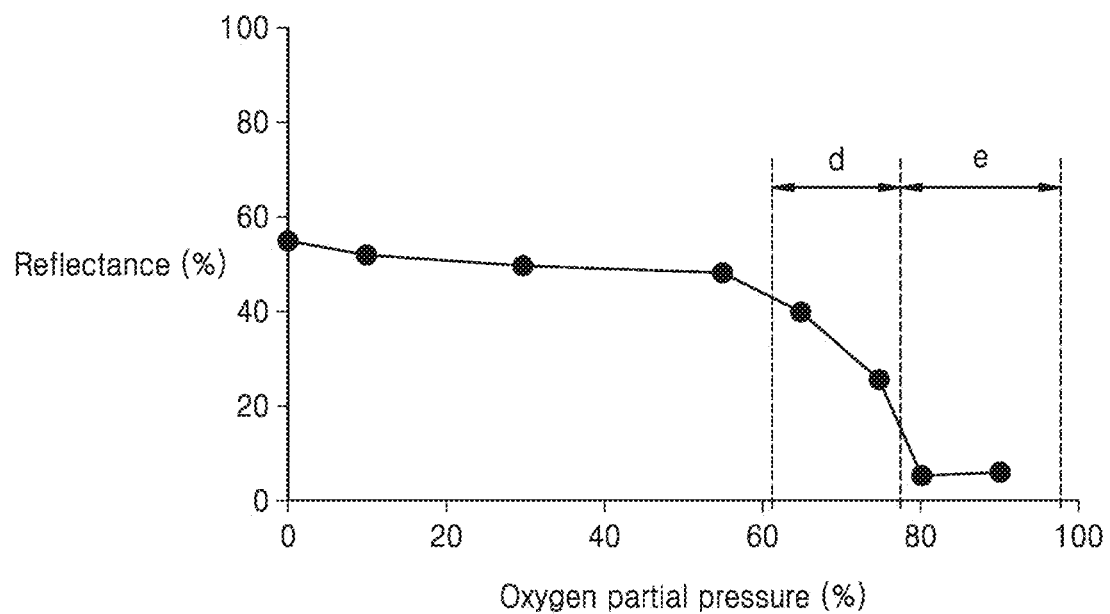
FIG. 19 is a graph showing results of water solubility according to oxygen partial pressure of molybdenum oxide ($MoO_x$).

FIG. 19 is a graph showing results of water solubility according to oxygen partial pressure of molybdenum oxide ($MoO_x$). FIG. 19 is a graph showing results of irradiating light to molybdenum oxide ($MoO_x$) after forming molybdenum oxide ($MoO_x$) on the substrate 100. In FIG. 19, in a case where oxygen partial pressure of molybdenum oxide ($MoO_x$) is low, it may mean that oxygen concentration of molybdenum oxide ($MoO_x$) is low.

Referring to FIG. 19, in a case where oxygen partial pressure of molybdenum oxide ($MoO_x$) is low, it is shown that reflectivity with respect to light is high. That is, in the case where oxygen partial pressure of molybdenum oxide ($MoO_x$) is low, molybdenum oxide ($MoO_x$) may exist in a metal state and exist on the substrate 100 without being dissolved in water.

As oxygen partial pressure of molybdenum oxide ($MoO_x$) increases, it is shown that reflectivity with respect to light reduces. That is, as oxygen partial pressure of molybdenum oxide ($MoO_x$) increases, water solubility of molybdenum oxide ($MoO_x$) increases. In an embodiment, for example, as oxygen partial pressure of molybdenum oxide ($MoO_x$) increases, water solubility of molybdenum oxide ($MoO_x$) may increase. That is, as oxygen partial pressure of molybdenum oxide ($MoO_x$) increases, molybdenum oxide ($MoO_x$) may be better dissolved in water.

In an embodiment, the oxide material layer 150 may include molybdenum oxide ($MoO_x$). In such an embodiment, oxygen partial pressure of molybdenum oxide ($MoO_x$) may be about 60% or more. Alternatively, oxygen partial pressure of molybdenum oxide ($MoO_x$) may be about 80% or more. In an embodiment where the oxide material layer 150 includes molybdenum oxide ($MoO_x$), and oxygen partial pressure of molybdenum oxide ($MoO_x$) is about 80% or more, the oxide material layer 150 may be removed together during the stripping process of removing the photoresist pattern 155, and thus, the residual materials 116 existing inside the contact hole CNT may be easily removed.

According to embodiments a display apparatus and a method of manufacturing the display apparatus, as described herein, remaining of an inorganic layer when forming a contact hole exposing at least a portion of a semiconductor layer is effectively prevented or substantially reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate;
a first semiconductor layer disposed over the substrate;
a first insulating layer disposed on the first semiconductor layer;
a second insulating layer disposed on the first insulating layer;
a first oxide material layer disposed between the substrate and the second insulating layer and having water solubility; and
a first conductive layer disposed on the second insulating layer and electrically connected to the first semiconductor layer through a first contact hole defined in the first insulating layer, the second insulating layer, and the first oxide material layer.

2. The display apparatus of claim 1, wherein the first oxide material layer is disposed between the first insulating layer and the second insulating layer.

3. The display apparatus of claim 1, wherein the first oxide material layer is disposed between the first semiconductor layer and the first insulating layer.

4. The display apparatus of claim 1, wherein the first oxide material layer includes at least one selected from molybdenum oxide ($MoO_x$) and tungsten oxide ($WO_x$).

5. The display apparatus of claim 1, wherein the first oxide material layer has a thickness in a range of about 30 Å to about 300 Å.

6. The display apparatus of claim 1, further comprising:
a first gate electrode insulated from the first semiconductor layer; and
an upper electrode disposed between the first insulating layer and the second insulating layer.

7. The display apparatus of claim 6, wherein the first oxide material layer is disposed directly on the upper electrode.

8. The display apparatus of claim 1, further comprising:
a second semiconductor layer disposed in a layer different from a layer in which the first semiconductor layer is disposed,
wherein
the first semiconductor layer includes an oxide semiconductor material, and
the second semiconductor layer includes a silicon semiconductor material.

9. The display apparatus of claim 8, wherein the second semiconductor layer is disposed closer to the substrate than the first semiconductor layer.

10. The display apparatus of claim 8, further comprising:
a second conductive layer disposed on the second insulating layer,
wherein the second conductive layer is electrically connected to the second semiconductor layer through a second contact hole.

11. The display apparatus of claim 8, further comprising:
a second gate electrode insulated from the second semiconductor layer; and
a second oxide material layer disposed on the second gate electrode.

12. The display apparatus of claim 1, further comprising:
a bottom metal layer disposed on the substrate; and
a buffer layer disposed between the bottom metal layer and the first semiconductor layer.

13. The display apparatus of claim 12, wherein the first oxide material layer is disposed between the bottom metal layer and the first semiconductor layer.

14. The display apparatus of claim 12, wherein the first conductive layer is electrically connected to the bottom metal layer through a third contact hole.

15. A method of manufacturing a display apparatus, the method comprising:
providing a semiconductor layer on a substrate;

providing a first insulating layer on the semiconductor layer;
providing an oxide material layer having water solubility on the first insulating layer;
providing a second insulating layer on the oxide material layer;
providing a photoresist pattern on the second insulating layer;
forming a contact hole by etching the first insulating layer, the oxide material layer, and the second insulating layer by using the photoresist pattern as an etch mask; and
stripping the photoresist pattern.

16. The method of claim 15, wherein
at least a portion of the oxide material layer is removed when the photoresist pattern is stripped.

17. The method of claim 15, wherein the oxide material layer includes at least one selected from molybdenum oxide ($MoO_x$) and tungsten oxide ($WO_x$).

18. The method of claim 15, wherein the oxide material layer has a thickness in a range of about 30 Å to about 300 Å.

19. The method of claim 15, further comprising:
after the stripping the photoresist pattern, providing a conductive layer on the second insulating layer.

20. The method of claim 19, wherein the conductive layer is electrically connected to the semiconductor layer through the contact hole.

* * * * *